(12) United States Patent
Zhang et al.

(10) Patent No.: US 9,343,406 B2
(45) Date of Patent: May 17, 2016

(54) DEVICE HAVING SELF-REPAIR CU BARRIER FOR SOLVING BARRIER DEGRADATION DUE TO RU CMP

(71) Applicant: GLOBALFOUNDRIES Inc., Grand Cayman (KY)

(72) Inventors: Xunyuan Zhang, Albany, NY (US); Kunaljeet Tanwar, Slingerlands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/550,531

(22) Filed: Nov. 21, 2014

(65) Prior Publication Data

US 2015/0130063 A1 May 14, 2015

Related U.S. Application Data

(62) Division of application No. 14/079,305, filed on Nov. 13, 2013, now Pat. No. 8,962,478.

(51) Int. Cl.
*H01L 23/532* (2006.01)
*H01L 21/768* (2006.01)

(52) U.S. Cl.
CPC .... *H01L 23/53238* (2013.01); *H01L 21/76843* (2013.01); *H01L 21/76879* (2013.01); *H01L 23/5329* (2013.01); *H01L 21/76846* (2013.01); *H01L 21/76877* (2013.01); *H01L 2924/0002* (2013.01)

(58) Field of Classification Search
None
See application file for complete search history.

(56) References Cited

U.S. PATENT DOCUMENTS

2010/0314774 A1* 12/2010 Zhang et al. .................. 257/773
2013/0140698 A1* 6/2013 Lakshmanan et al. ........ 257/751
2013/0307150 A1* 11/2013 Edelstein et al. ............. 257/741

OTHER PUBLICATIONS

Along. (n.d.) American Heritage® Dictionary of the English Language, Fifth Edition. (2011). Retrieved Aug. 17, 2015 from http://www.thefreedictionary.com/along.*

* cited by examiner

*Primary Examiner* — Mohammad Islam
*Assistant Examiner* — Mikka Liu
(74) *Attorney, Agent, or Firm* — Ditthavong & Steiner, P.C.

(57) ABSTRACT

A method of forming a doped TaN Cu barrier adjacent to a Ru layer of a Cu interconnect structure and the resulting device are provided. Embodiments include forming a cavity in a SiO-based ILD; conformally forming a doped TaN layer in the cavity and over the ILD; conformally forming a Ru layer on the doped TaN layer; depositing Cu over the Ru layer and filling the cavity; planarizing the Cu, Ru layer, and doped TaN layer down to an upper surface of the ILD; forming a dielectric cap over the Cu, Ru layer, and doped TaN layer; and filling spaces formed between the dielectric cap and the doped TaN layer.

20 Claims, 6 Drawing Sheets

DEVICE HAVING SELF-REPAIR CU BARRIER FOR SOLVING BARRIER DEGRADATION DUE TO RU CMP

CROSS REFERENCE TO RELATED APPLICATION

This application is a Divisional of U.S. application Ser. No. 14/079,305, filed Nov. 13, 2013, the content of which is incorporated herein by reference in its entirety.

TECHNICAL FIELD

The present disclosure relates to manufacture of semiconductor devices with copper (Cu) interconnect structures. The present disclosure is particularly applicable to 14 nanometer (nm) technology nodes and beyond.

BACKGROUND

As back end of line (BEOL) processes are scaled down, filling copper dual damascene trenches becomes more difficult. A known approach involves using a linear material such as ruthenium (Ru) and cobalt (Co) to facilitate Cu filling. In particular, a cavity is formed in an ultra-low k dielectric (ULK) 101, e.g., a dielectric having a dielectric constant less than 3, as depicted in FIG. 1A. Next, a tantalum nitride/tantalum (TaN/Ta) layer 121 is conformally formed in the cavity and over the ULK 101 to a thickness of 1 nm to 10 nm, as illustrated in FIG. 1B. Adverting to FIG. 1C, a Ru layer 131 is conformally formed over the TaN/Ta layer 121 to a thickness of 0.5 nm to 5 nm. Thereafter, Cu 141 is deposited over the Ru layer 131, filling the cavity, as depicted in FIG. 1D. Adverting to FIG. 1E, the Cu 141, the Ru layer 131, and the TaN/Ta layer 121 are planarazied by chemical mechanical polishing (CMP). However, because the polishing rate of the Ru layer 131, e.g., 5 nm/min, is much slower than the polishing rate of the TaN/Ta layer 121, e.g., 50-70 nm/min, the TaN/Ta layer 121 is degraded in a number of places along the trench leaving spaces 143 between the ULK 101 and the Ru layer 131. Next, a dielectric cap 151 is deposited over the TaN/Ta layer 121, the spaces 143, the Ru layer 131, and the Cu 141, as illustrated in FIG. 1F. Since a space remains at 143, device reliability is reduced by issues such as barrier and/or time-dependent dielectric breakdown (TDDB) degradation.

A need therefore exists for methodology enabling formation of an improved Cu barrier, and the resulting device.

SUMMARY

An aspect of the present disclosure is a method of forming a Cu barrier of doped TaN adjacent to a Ru layer of a Cu interconnect structure.

Another aspect of the present disclosure is a device including a Cu barrier formed of a doped TaN layer and manganese silicate ($Mn_xSiO_y$) or aluminum silicate ($Al_xSiO_y$) adjacent to a Ru layer of a Cu interconnect structure.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a cavity in a silicon oxide-based (SiO-based) interlayer dielectric (ILD); conformally forming a doped TaN layer in the cavity and over the ILD; conformally forming a Ru layer on the doped TaN layer; depositing Cu over the Ru layer and filling the cavity; planarizing the Cu, Ru layer, and doped TaN layer down to an upper surface of the ILD; forming a dielectric cap over the Cu, Ru layer, and doped TaN layer; and filling spaces formed between the dielectric cap and the doped TaN layer.

Aspects of the present disclosure include forming the doped TaN layer by plasma-enhanced atomic layer deposition (PEALD). Other aspects include forming the doped TaN layer at a temperature of 100° C. to 300° C. Further aspects include forming the doped TaN layer at a pressure of 0.1 Torr to 10 Torr. Another aspect includes forming the doped TaN layer to a thickness of 1 nm to 10 nm. Additional aspects include forming the doped TaN layer by implanting a dopant comprising Mn or Al. Other aspects include implanting the dopant at a concentration of 1% to 10% (atomic percent). Further aspects include forming the Ru layer to a thickness of 0.5 nm to 5 nm. Another aspect includes planarizing the Cu, Ru layer, and doped TaN layer by CMP. Additional aspects include forming the dielectric cap of silicon nitride (SiN). Other aspects include forming the dielectric cap by deposition at a temperature of 300° C. to 400° C. Further aspects include forming the dielectric cap at 300° C. to 400° C. for 1 to 10 minutes. Another aspect includes forming the dielectric cap to a thickness of 10 nm to 30 nm. Additional aspects include Mn or Al dopants within the doped TaN layer reacting with the SiO-based ILD to form $Mn_xSiO_y$ or $Al_xSiO_y$, respectively, to fill any spaces between the doped TaN layer and the dielectric cap.

Another aspect of the present disclosure is a device including: a SiO-based ILD, including a cavity; a doped TaN layer conformally formed in the cavity of the SiO-based ILD; a Ru layer conformally formed on the doped TaN layer; a Cu layer formed over the Ru layer, filling the cavity; a dielectric cap formed over the Cu, Ru, and doped TaN layers; and manganese silicate $Mn_xSiO_y$ or $Al_xSiO_y$ formed between the doped TaN layer and the dielectric cap. Aspects of the device include the TaN layer being doped with Mn or Al. Other aspects include the dielectric cap being formed by deposition at a temperature of 300° C. to 400° C. Further aspects include the SiO-based ILD being formed of a ULK.

Another aspect of the present disclosure is a method including: forming a cavity in a SiO-based ILD; conformally forming a Mn or Al doped layer of TaN in the cavity and over the ILD to a thickness of 1 nm to 10 nm; conformally forming a Ru layer on the Mn or Al doped TaN layer to a thickness of 0.5 nm to 5 nm; depositing Cu over the Ru layer, filling the cavity; planarizing the Cu, Ru layer, and Mn or Al doped TaN layer down to an upper surface of the ILD by chemical mechanical polishing CMP; and depositing a SiN dielectric cap over the Cu, Ru layer, and Mn or Al doped TaN layer at a temperature of 300° C. to 400° C. for 1 to 10 minutes.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of TaN/Ta barrier and/or TDDB degradation attendant upon CMP of a Ru liner and TaN/Ta barrier in forming a Cu interconnect structure. By doping a TaN barrier layer with Mn or Al adjacent to the Ru liner, a silicate forms at locations of barrier degradation, thereby resolving the problem of TaN barrier degradation.

Methodology in accordance with embodiments of the present disclosure includes forming a cavity in a SiO-based ILD. A doped TaN layer and a Ru layer are sequentially conformally formed in the cavity and over the ILD. Cu is then deposited over the Ru layer and filling the cavity. The Cu, Ru layer, and doped TaN layer are planarized down to an upper surface of the ILD. A dielectric cap is formed over the Cu, Ru layer, and doped TaN layer. Then, spaces formed between the dielectric cap and the doped TaN layer are filled.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
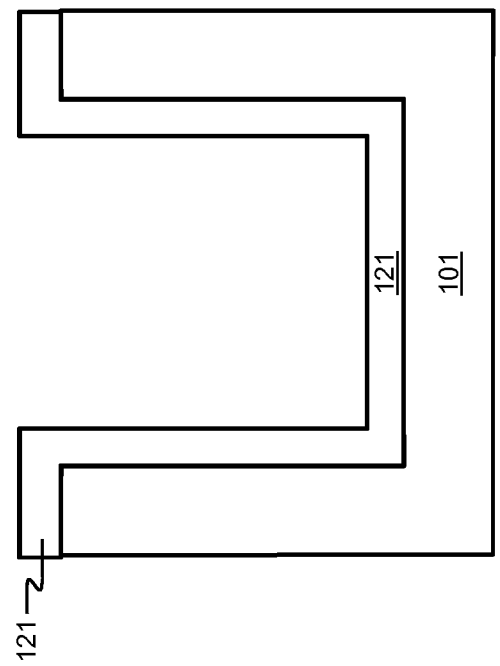
FIGS. 1A through 1F schematically illustrate sequential steps of a background method of forming a Cu barrier of TaN/Ta adjacent to a Ru layer of a Cu interconnect structure.
Figure 1A:
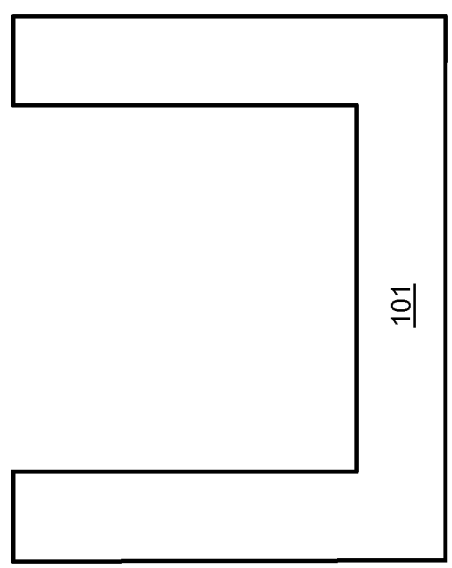
Figure 1D:
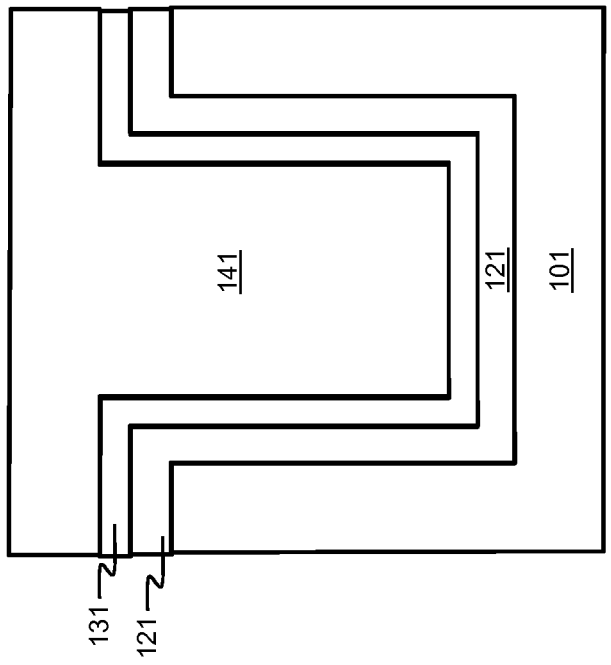
Figure 1C:
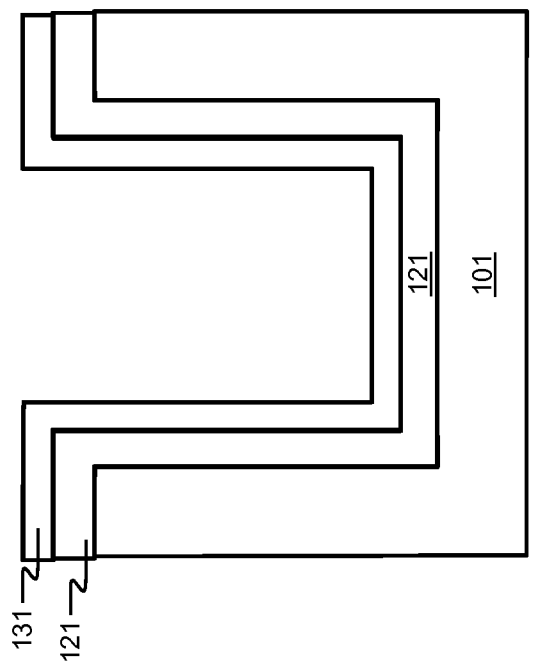
Figure 1F:
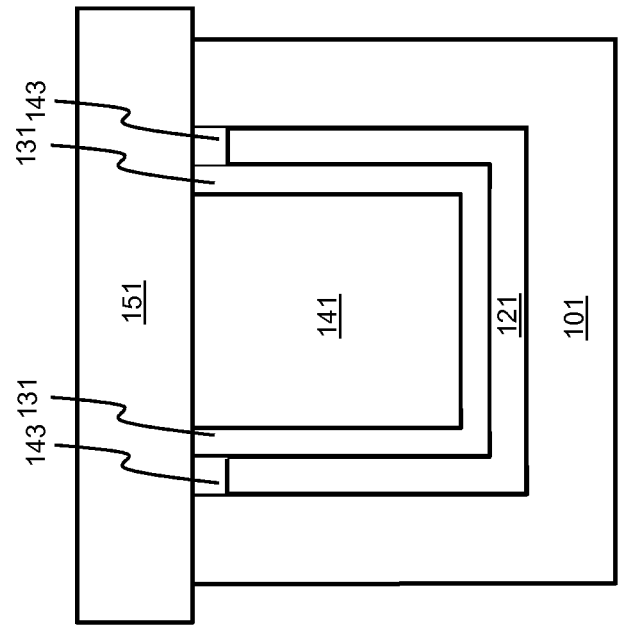
Figure 1E:
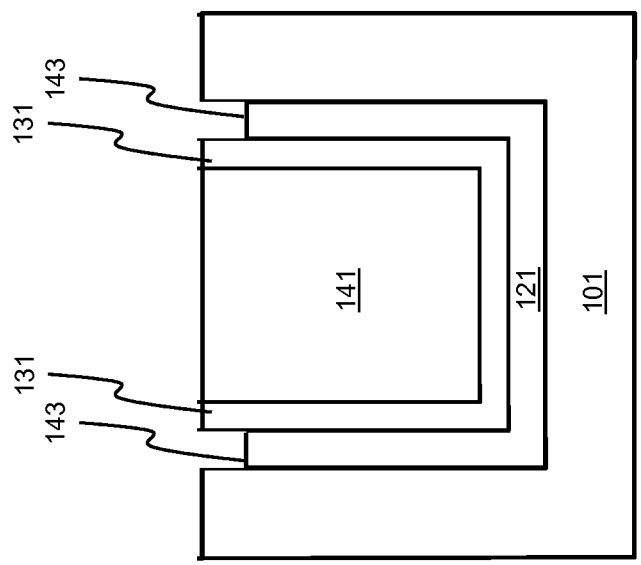
Figure 3:
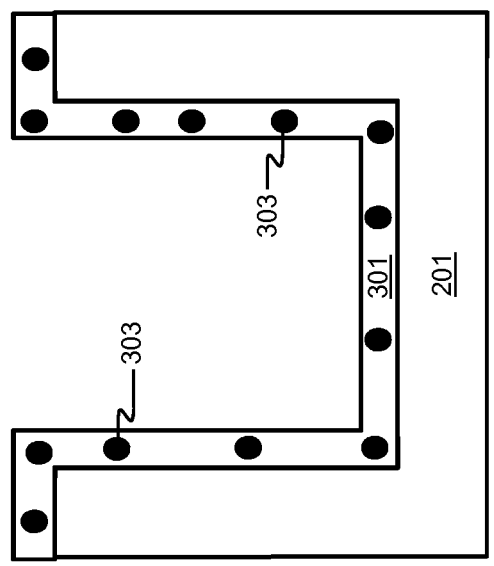
Figure 2:
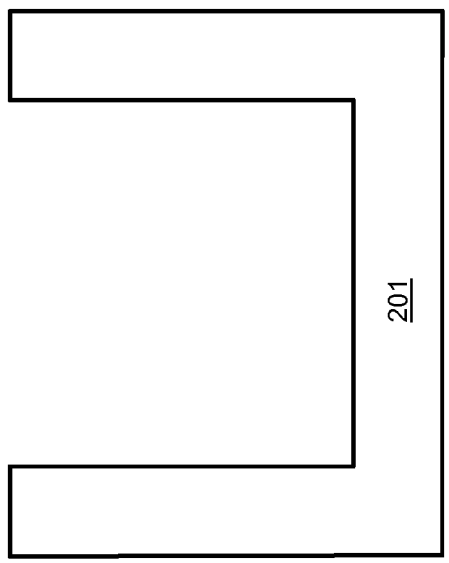
FIGS. 2 and 7 schematically illustrate sequential steps of a method of forming a Cu barrier of Mn or Al doped TaN adjacent to a Ru layer of a Cu interconnect structure, in accordance with an exemplary embodiment.
Figure 7:
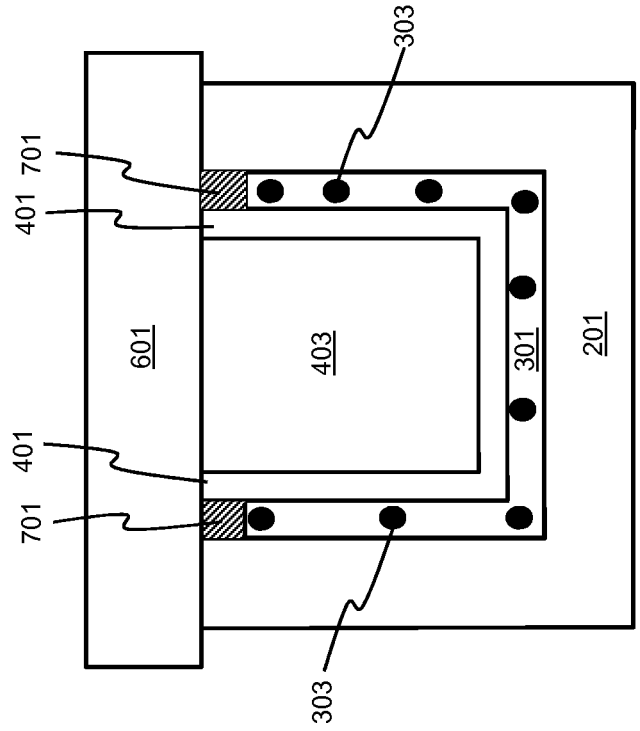

FIGS. 2 and 7 schematically illustrate sequential steps of a method of forming a Cu barrier of Mn or Al doped TaN adjacent to a Ru layer of a Cu interconnect structure, in accordance with an exemplary embodiment. Adverting to FIG. 2, similar to background processes discussed with respect to FIG. 1A, a cavity is formed in a SiO-based ILD 201. Alternatively, a cavity can also be formed in an ULK. Next, a doped TaN layer 301, implanted with a 1 to 10 atomic percent (at. %) concentration of a Mn or Al dopant 303, is conformally deposited, for example by PEALD, in the cavity and over the ILD 201, e.g. to a thickness of 1 nm to 10 nm, as illustrated in FIG. 3. The doped TaN layer 301 is deposited, for example, at a temperature of 100° C. to 300° C. and at a pressure of 0.1 Torr to 10 Torr.

Figure 5:
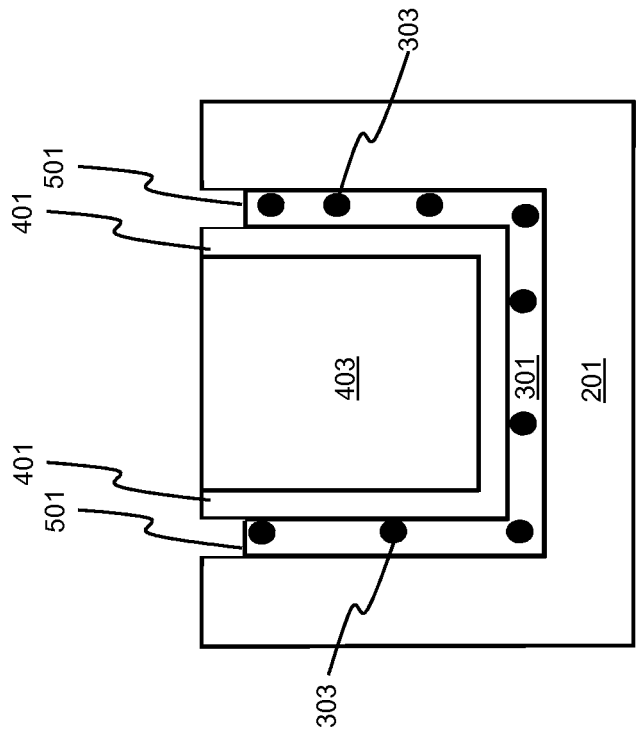
Figure 4:
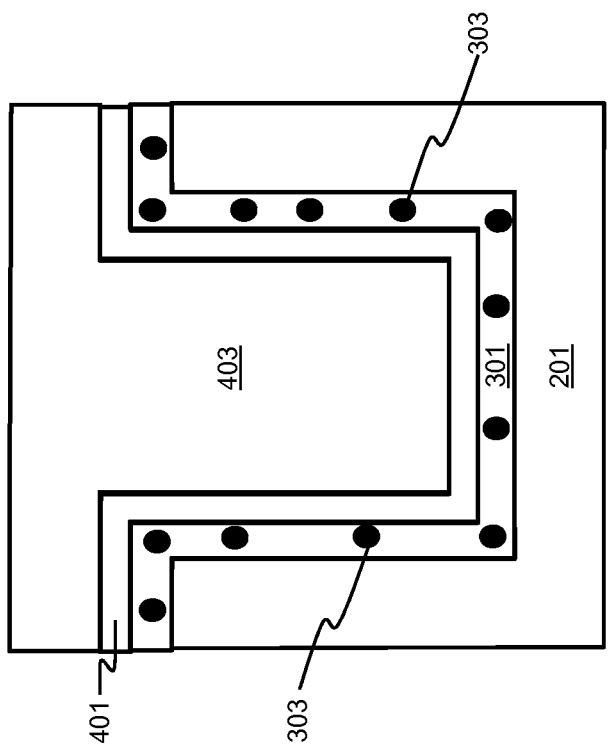

Adverting to FIG. 4, a Ru layer 401 is deposited to a thickness of 0.5 nm to 5 nm on the doped TaN layer 301. Next, Cu 403 is deposited over the Ru layer 401 and filling the cavity. The Cu 403, the Ru layer 401, and the doped TaN layer 301 are then planarized by CMP down to the upper surface of the ILD 201, as illustrated in FIG. 5. However, because removing the Ru layer 401 by CMP is slow, e.g., 5 nm/min, relative to removing the doped TaN layer 301 by CMP, e.g., 50 nm/min to 70 nm/min, the doped TaN layer 301 is degraded in a number of places like spaces 501 formed between the ILD 201 and the Ru layer 401 along the trench, similar to the prior art.

Figure 6:
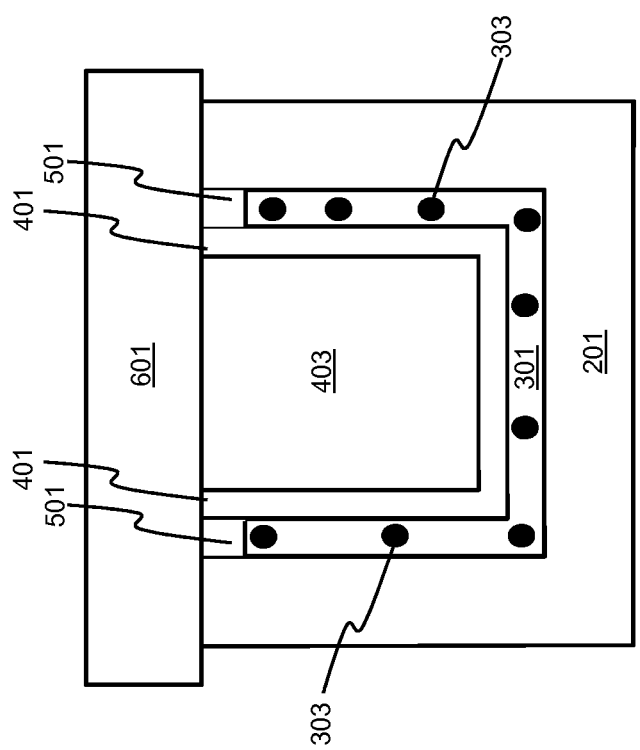

Adverting to FIG. 6, a SiN dielectric cap 601 is deposited over the Cu 403, the Ru layer 401, the spaces 501 and the doped TaN layer 301, e.g. to a thickness of 10 nm to 30 nm, with spaces remaining at 501. The SiN dielectric cap 601 is deposited, for example, at a temperature of 300° C. to 400° C. for 1 to 10 minutes. Consequently, the Mn or Al dopant 303 reacts with the SiO-based ILD 201 to form $Mn_xSiO_y$ or $Al_xSiO_y$ 701, respectively, filling any spaces 501 between the doped TaN layer 301 and the dielectric cap 601, as illustrated in FIG. 7.

The embodiments of the present disclosure can achieve several technical effects including improved device reliability, i.e., reducing barrier and TDDB degradation as a result of Ru CMP. Moreover, time and effort may be saved by eliminating the need for evaluating and optimizing CMP slurries to match the polish rate between Ru and TaN. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of integrated circuits including copper interconnect structures, particularly for 14 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a silicon oxide-based (SiO-based) interlayer dielectric (ILD), including a cavity;
   a doped tantalum nitride (TaN) layer conformally formed in the cavity of the SiO-based ILD;
   a ruthenium (Ru) layer conformally formed on the doped TaN layer;
   a copper (Cu) layer formed over the Ru layer, filling the cavity;
   a dielectric cap formed over the Cu, Ru, and doped TaN layers; and
   manganese silicate ($Mn_xSiO_y$) or aluminum silicate ($Al_xSiO_y$) formed between the doped TaN layer and the dielectric cap and between the Ru layer and the SiO-based ILD.

2. The device according to claim 1, wherein the TaN layer is doped with manganese (Mn) or aluminum (Al).

3. The device according to claim 1, wherein the doped TaN layer has a thickness of 1 to 10 nanometers (nm).

4. The device according to claim 1, wherein the Ru layer has a thickness of 0.5 to 5 nm.

5. The device according to claim 1, wherein the SiO-based ILD comprises an ultralow-k (ULK) dielectric.

6. The device according to claim 1, wherein the dielectric cap comprises silicon nitride (SiN).

7. The device according to claim 1, wherein the dielectric cap has a thickness of 10 to 30 nm.

8. The device according to claim 1, wherein the dielectric cap is formed by deposition at a temperature of 300° to 400° C.

9. The device according to claim 8, wherein the dielectric cap is formed by deposition for 1 to 10 minutes.

10. The device according to claim 1, wherein the copper layer forms an interconnect structure.

11. A device comprising:
a silicon oxide-based (SiO-based) interlayer dielectric (ILD);
a copper (Cu) interconnect formed in the SiO-based ILD;
a conformal ruthenium (Ru) liner on side and bottom surfaces of the Cu interconnect;
a conformal doped tantalum nitride (TaN) layer doped with manganese (Mn) or aluminum (Al) around the Ru liner, the Cu interconnect, the Ru liner, and the doped TaN layer being planarized, forming spaces between the Ru liner and the ILD along a top surface of the doped TaN layer;
a dielectric cap deposited over the Cu interconnect, Ru liner, doped TaN layer, and spaces at a temperature of 3000 to 4000 C; and
manganese silicate ($Mn_xSiO_y$) or aluminum silicate ($Al_xSiO_y$) filling the spaces and formed during deposition of the dielectric cap, wherein the $Mn_xSiO_y$ or $Al_xSiO_y$ is formed between the doped TaN layer and the dielectric cap and between the Ru liner and the SiO-based ILD.

12. The device according to claim 11, wherein the doped TaN layer has a thickness of 1 to 10 nanometers (nm).

13. The device according to claim 11, wherein the Ru liner has a thickness of 0.5 to 5 nm.

14. The device according to claim 11, wherein the SiO-based ILD comprises an ultralow-k (ULK) dielectric.

15. The device according to claim 11, wherein the dielectric cap comprises silicon nitride (SiN).

16. The device according to claim 11, wherein the dielectric cap has a thickness of 10 to 30 nm.

17. The device according to claim 11, wherein the dielectric cap is formed by deposition for 1 to 10 minutes.

18. A device comprising:
a silicon oxide-based (SiO-based) interlayer dielectric (ILD);
a copper (Cu) interconnect formed in the SiO-based ILD;
a conformal ruthenium (Ru) liner having a thickness of 0.5 to 5 nanometers (nm) on side and bottom surfaces of the Cu interconnect;
a conformal doped tantalum nitride (TaN) layer doped with manganese (Mn) or aluminum (Al) and having a thickness of 1 to 10 nm around the Ru liner,
wherein the Ru liner, the Cu interconnect and the doped TaN layer are planarized, forming spaces between the Ru liner and the ILD along a top surface of the doped TaN layer;
a silicon nitride (SiN) dielectric cap having a thickness of 10 to 30 nm deposited over the Cu interconnect; and
manganese silicate ($Mn_xSiO_y$) or aluminum silicate ($Al_xSiO_y$) filling the spaces and formed during deposition of the SiN dielectric cap, wherein the $Mn_xSiO_y$ or $Al_xSiO_y$ is formed between the doped TaN layer and the SiN dielectric cap and between the Ru liner and the SiO-based ILD.

19. The device according to claim 18, wherein the SiO-based ILD comprises an ultralow-k (ULK) dielectric.

20. The device according to claim 18, wherein the dielectric cap is formed by deposition for 1 to 10 minutes.

* * * * *